US009761183B2

(12) United States Patent
Yang et al.

(10) Patent No.: US 9,761,183 B2
(45) Date of Patent: Sep. 12, 2017

(54) DISPLAY PANEL TESTING BENCH

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Depo Yang, Beijing (CN); Si Chen, Beijing (CN); Hongliang Xu, Beijing (CN); Kuohai Wang, Beijing (CN); Liang Zheng, Beijing (CN)

(73) Assignees: BOE Technology Group Co., Ltd., Beijing (CN); Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 15/097,852

(22) Filed: Apr. 13, 2016

(65) Prior Publication Data

US 2016/0356812 A1 Dec. 8, 2016

(30) Foreign Application Priority Data

Jun. 5, 2015 (CN) .......................... 2015 1 0307079

(51) Int. Cl.
*G01R 31/20* (2006.01)
*G09G 3/36* (2006.01)
*G09G 3/00* (2006.01)

(52) U.S. Cl.
CPC ............... *G09G 3/36* (2013.01); *G09G 3/006* (2013.01)

(58) Field of Classification Search
CPC ...................................................... G09G 3/006
(Continued)

(56) References Cited

U.S. PATENT DOCUMENTS 5,459,409 A * 10/1995 Henley .................. G09G 3/006 324/530
5,465,052 A * 11/1995 Henley .................. G11C 29/50 324/760.02
(Continued)

FOREIGN PATENT DOCUMENTS

CN 104034964 A * 9/2014 ............. G09G 3/006
CN 104076537 A * 10/2014 ........... H01L 27/124
(Continued)

OTHER PUBLICATIONS

Westar, QuickTEST II+, Westar Display Technologies, www.westardisplaytechnologies.com, May 9, 2016.*
(Continued)

*Primary Examiner* — Jermele M Hollington
*Assistant Examiner* — Sean Curtis
(74) *Attorney, Agent, or Firm* — Collard & Roe, P.C.

(57) ABSTRACT

A display panel testing bench, wherein the display panel testing bench comprises: a bench base, a chassis, a probe assembly, and a linkage assembly; a bench base moving assembly is disposed on the chassis; the bench base is movable on the chassis by the bench base moving assembly, the bench base is configured to fix a display panel; the linkage assembly is disposed on the chassis, and is configured to perform a joint movement of the probe assembly and the bench base; the probe assembly is disposed above the bench base; wherein, when the bench base is moved on the chassis by the bench base moving assembly, the bench base drives the linkage assembly, and the probe assembly is driven by the linkage assembly to move above the display panel.

12 Claims, 7 Drawing Sheets

(58) Field of Classification Search
USPC ............ 324/750.25, 750.13, 750.16, 750.19, 324/750.22
See application file for complete search history.

(56) References Cited

U.S. PATENT DOCUMENTS

| | | | | | |
|---|---|---|---|---|---|
| 5,473,261 | A * | 12/1995 | Marumoto | G09G 3/006 | 324/760.01 |
| 5,764,209 | A * | 6/1998 | Hawthorne | G06F 11/2221 | 345/87 |
| 5,801,545 | A * | 9/1998 | Takekoshi | G09G 3/006 | 324/750.25 |
| 5,801,764 | A * | 9/1998 | Koizumi | G09G 3/006 | 348/125 |
| 6,014,035 | A * | 1/2000 | Taniguchi | G09G 3/006 | 324/73.1 |
| 6,087,839 | A * | 7/2000 | Choi | G01R 31/2806 | 324/763.01 |
| 6,124,725 | A * | 9/2000 | Sato | G01R 31/2851 | 324/754.03 |
| 6,137,300 | A * | 10/2000 | Hayashida | G09G 3/006 | 324/750.18 |
| 6,150,833 | A * | 11/2000 | Lin | G01R 1/0408 | 269/110 |
| 6,281,701 | B1 * | 8/2001 | Yang | G09G 3/006 | 324/233 |
| 6,417,686 | B1 * | 7/2002 | Yaniv | G09G 3/006 | 324/754.03 |
| 7,129,694 | B2 * | 10/2006 | Brunner | H01L 21/682 | 324/750.14 |
| 7,355,418 | B2 * | 4/2008 | Brunner | G01R 1/07364 | 324/750.25 |
| 7,468,611 | B2 * | 12/2008 | Nguyen | G09G 3/006 | 324/750.22 |
| 8,184,923 | B2 * | 5/2012 | Hayakawa | G09G 3/006 | 382/264 |
| 8,492,739 | B2 * | 7/2013 | Choi | G01J 1/08 | 250/226 |
| 2002/0135395 | A1 * | 9/2002 | Smith | G02F 1/1309 | 324/750.2 |
| 2003/0112331 | A1 * | 6/2003 | Chen | G09G 3/006 | 348/94 |
| 2004/0155838 | A1 * | 8/2004 | Toro-Lira | G01R 31/305 | 345/75.2 |
| 2005/0237081 | A1 * | 10/2005 | Chidambaram | G01R 31/2889 | 324/750.22 |
| 2005/0264309 | A1 * | 12/2005 | Chung | G09G 3/006 | 324/754.03 |
| 2006/0279307 | A1 * | 12/2006 | Wang | G01R 31/01 | 324/750.24 |
| 2006/0284641 | A1 * | 12/2006 | Wang | G09G 3/006 | 324/757.01 |
| 2006/0290371 | A1 * | 12/2006 | Yang | G01R 31/01 | 324/754.08 |
| 2007/0013408 | A1 * | 1/2007 | Hamamoto | G09G 3/006 | 324/754.03 |
| 2008/0088336 | A1 * | 4/2008 | Pommerenke | G01R 31/002 | 324/754.21 |
| 2008/0094081 | A1 * | 4/2008 | Nguyen | G09G 3/006 | 324/750.19 |
| 2008/0224724 | A1 * | 9/2008 | Glazer | G09G 3/006 | 324/754.23 |
| 2009/0224777 | A1 * | 9/2009 | Kim | G02F 1/1309 | 324/760.01 |
| 2011/0068816 | A1 * | 3/2011 | Kwon | G02F 1/1309 | 324/756.01 |
| 2013/0068368 | A1 * | 3/2013 | Kim | G01R 31/2635 | 156/64 |
| 2014/0145739 | A1 * | 5/2014 | Park | G09G 3/20 | 324/750.3 |
| 2016/0356812 | A1 * | 12/2016 | Yang | G09G 3/006 | |

FOREIGN PATENT DOCUMENTS

| | | | | | |
|---|---|---|---|---|---|
| CN | 104777637 | A | * | 7/2015 | G09G 3/006 |
| EP | 0613014 | A1 | * | 8/1994 | G01R 1/0735 |
| JP | 11065475 | A | * | 3/1999 | G01R 1/0408 |
| JP | EP 0943951 | A1 | * | 9/1999 | G02F 1/1309 |
| JP | 2015102478 | A | * | 6/2015 | G09G 3/006 |
| KR | 20020058791 | A | * | 7/2002 | G09G 3/006 |
| KR | WO 2004049429 | A1 | * | 6/2004 | G01R 1/07307 |
| KR | 20070028003 | A | * | 3/2007 | G09G 3/006 |
| KR | 20070028004 | A | * | 3/2007 | G02F 1/1303 |
| KR | 20070028637 | A | * | 3/2007 | G02F 1/1303 |

OTHER PUBLICATIONS

Instron, Automated XY Testing System, Illinois Tool Works, Inc. www.instron.us, 2014.*

Westar, FPM-520-FO System, Westar Display Technologies, www.westardisplaytechnolgoies.com, 2014.*

Westar, FPM-530-FO System, Westar Display Technologies, www.westardisplaytechnolgoies.com, 2014.*

* cited by examiner

DISPLAY PANEL TESTING BENCH

CROSS REFERENCE TO RELATED APPLICATIONS

Applicant claims priority under 35 U.S.C. §119 of Chinese Application No. 201510307079.7 filed on Jun. 5, 2015, the disclosure of which is incorporated by reference.

TECHNICAL FIELD

Embodiments of the present disclosure relate to a display panel testing bench.

BACKGROUND

In a process for producing a display panel (e.g. a liquid crystal display panel), some defects (for example, some damaged thin film transistors) may occur in a product itself. Therefore, the display panel needs to be tested. At present, the display panel is generally tested by means of a lightening region of the display panel (the display panel may be turn on by inputting electrical signals to the display panel through the lightening region).

SUMMARY

In accordance with an aspect of an embodiment of the present disclosure, there is provided a display panel testing bench, the display panel testing bench comprises: a bench base, a chassis, a probe assembly, and a linkage assembly; a bench base moving assembly is disposed on the chassis; the bench base is movable on the chassis by the bench base moving assembly, the bench base is configured to fix a display panel; the linkage assembly is disposed on the chassis, and is configured to perform a joint movement of the probe assembly and the bench base; the probe assembly is disposed above the bench base; wherein, when the bench base is moved on the chassis by the bench base moving assembly, the bench base drives the linkage assembly, and the probe assembly is driven by the linkage assembly to move above the display panel.

It should be understood that general description above and description in detail below are exemplary and illustrative only, and thus are not limitative of the invention.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 2-1 is a structural schematic diagram of another display panel testing bench according to an embodiment of the present disclosure;

FIG. 2-2 is a structural schematic diagram of still another display panel testing bench according to an embodiment of the present disclosure;

FIG. 2-3 is a structural schematic diagram of a further display panel testing bench according to an embodiment of the present disclosure;

FIG. 2-4 is a structural schematic diagram of the display panel testing bench illustrated in FIG. 2-3 having an installing groove being placed with a display panel;

FIG. 2-5 is a structural schematic diagram of a fixing assembly in the display panel testing bench provided by the embodiment illustrated in FIG. 2-3;

FIG. 2-6 is an schematic diagram of installing the fixing assembly and a bench base provided in the display panel testing bench provided by the embodiment illustrated in FIG. 2-3; and FIGS. 3-1 and 3-2 are operational schematic diagrams of the display panel testing bench provided ban embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Generally, a display panel testing bench is used to test a display panel. The display panel testing bench may include a bench base (for fixing the display panel) and a probe assembly (for connecting with a lightening region, and inputting electrical signals to the display panel). When the display panel testing bench is used, the display panel is disposed in the bench base to be fixed. Then, an operator will dispose the probe assembly on the lightening region and press it manually, so that probes of the probe assembly are stabbed into the lightening region (to connect the probe assembly with the lightening region). Then, electrical signals are input into the display panel through the probe assembly, thereby testing whether the display panel can work normally or not.

It is found by the inventor that the above method has following defects: the above method needs the operator press the probe assembly manually, so that the probe assembly can be controlled. It is difficult to control the probe assembly, and may damage the display panel.

Figure 1:
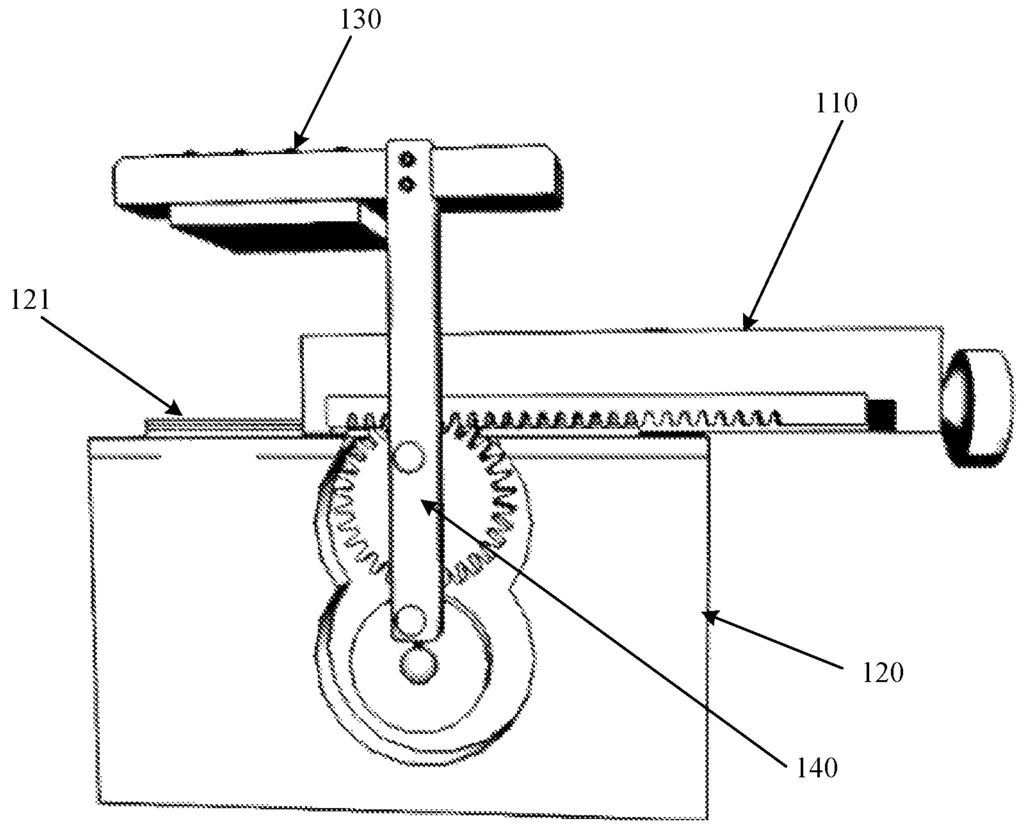
FIG. 1 is a structural schematic diagram of display panel testing bench according to an embodiment of the present disclosure.

FIG. 1 is a structural schematic diagram of a display panel testing bench according to an embodiment of the present disclosure. The display panel testing bench may include: a bench base 110, a chassis 120, a probe assembly 130, and a linkage assembly 140, and the probe assembly 130 may include probes.

A bench base moving assembly 121 may be disposed on the chassis 120.

The bench base 110 may be moved on the chassis 120 by the bench base moving assembly 121, and the bench base 110 is for fixing the display panel.

The linkage assembly 140 may be disposed on the chassis 120 to jointly move the probe assembly 130 and the bench base 110.

The probe assembly 130 may be disposed above the bench base 110.

For example, when the bench base 110 is moved on the chassis 120 by the bench base moving assembly 121, the linkage assembly 140 is driven. The linkage assembly 140 drives the probe assembly 130 to move above the display panel (not illustrated in FIG. 1). When the bench base 110 is moved to a predetermined position, the probe assembly 130 may also be moved to a corresponding predetermined position over the display panel. In the corresponding predetermined position, the probes of the probe assembly 130 may be just stabbed into a lightening region of the display panel.

In summary, the display panel testing bench provided by the embodiments of the present disclosure moves the bench base and the probe assembly jointly by the linkage assembly, so that the bench base can drive the probe assembly to move above the display panel through the linkage assembly when the bench base moves. It solves some problems in a related technology, such as, the probe assembly being controlled manually by the operator pressing it, the probe assembly being difficult to control, and having risks of damaging the display panel. Thus, an effect of the probe assembly being controlled safely and quickly may be achieved.

Figures 1, 2:
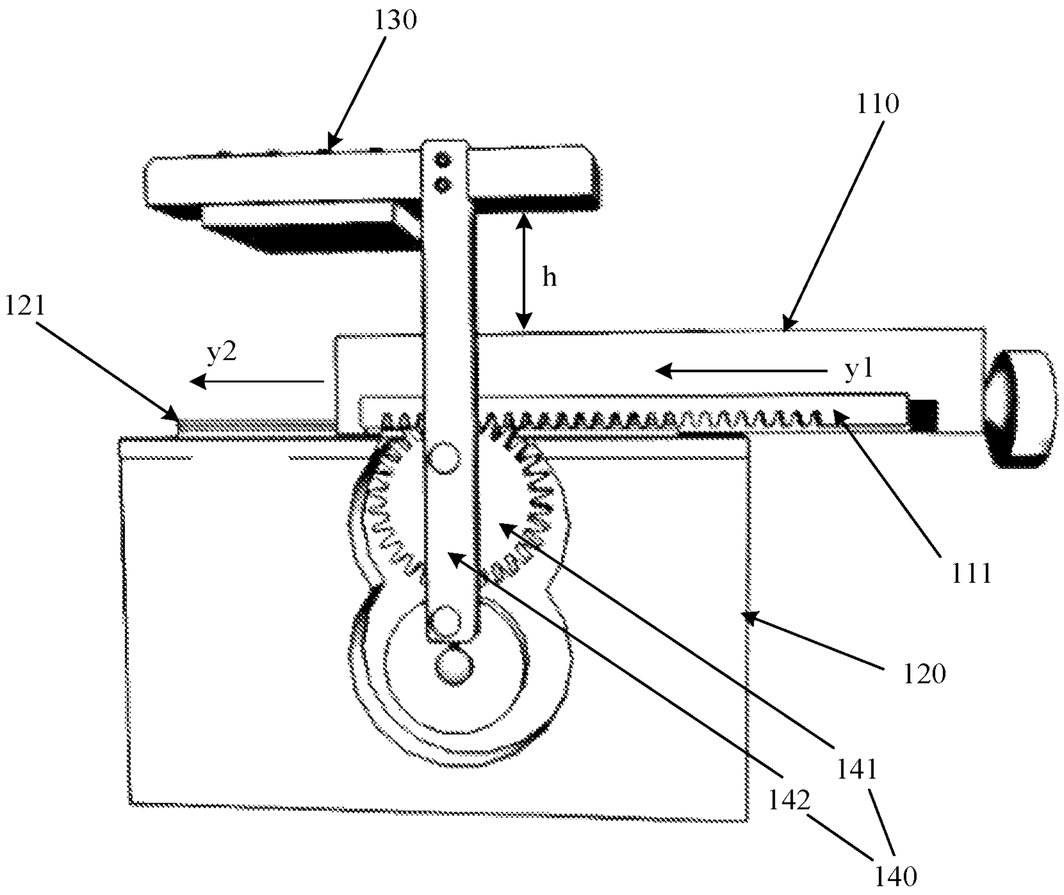
Figure 2:
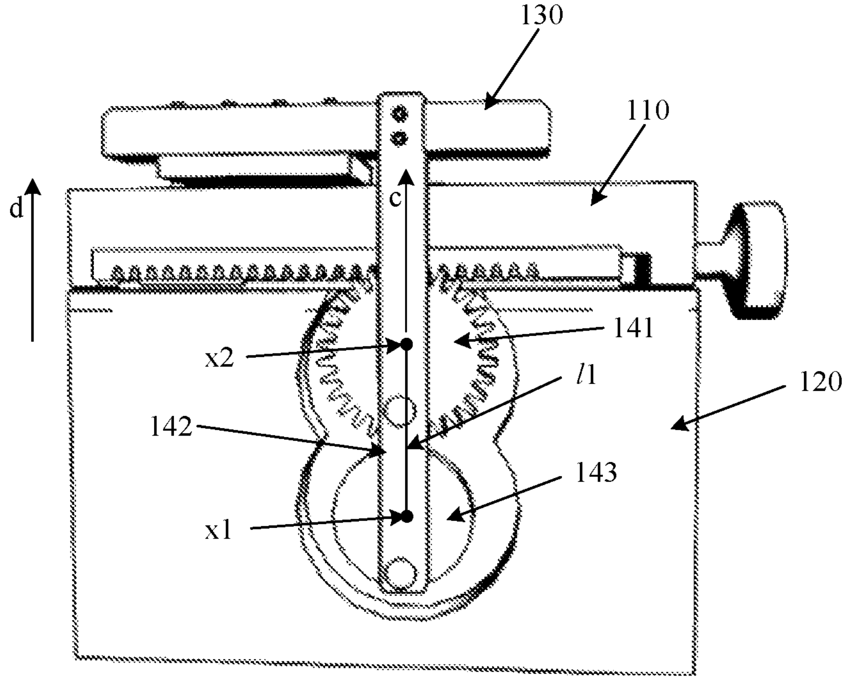

Further, FIG. 2-1 illustrates a structural schematic diagram of another display panel testing bench provided ban embodiment of the present disclosure. The display panel testing benches some new components on basis of the display panel testing bench as illustrated in FIG. 1, so that the display panel testing bench provided by the embodiment of the present disclosure may have a better performance.

For example, the linkage assembly 140 may include: a linkage gear 141 and a drive rod 142.

A rack 111 may be disposed at an edge of the bench base 110, the rack 111 may be coupled with the linkage gear 141, and the rack 111 has a length direction y1 parallel to a moving direction y2 of the bench base 110.

The drive rod 142 may be in a movable connection with the linkage gear 141. The movable connection may be implemented by a hinge, a bearing or the like, and the drive rod 142 may be connected with the probe assembly. For example, the drive rod 142 is detachably connected with the probe assembly 130. Lightening regions of different display panels may be located at different positions. And the display panel testing bench provided by the embodiments of the present disclosure can test many display panels with different lightening region positions by replacing the probe assembly.

The linkage gear 141 may be disposed on the chassis 120, and may be rotated around an axis of the linkage gear 141 (not illustrated in FIG. 2-1). For example, the bench base moving assembly 121 is a bench base slider module. The bench base slider module may include a slider and a track. The track may be disposed on the chassis 120, the slider may be disposed on the bench base 110, and the slider cooperates with the track, so that the bench base 110 can be moved on the chassis 120.

For example, when the bench base 110 is moved on the chassis 120, the rack 111 drives the linkage gear 141 to rotate, and the linkage gear 141 drives the drive rod 142 to change a height h of the probe assembly 130 from the bench base 110. When the bench base 110 is moved to a predetermined position (for example, an end of the bench base moving assembly 121, which is a position that the bench base 110 cannot be moved), the height h of the probe assembly 130 from the bench base 110 may just be such a height that the probes of the probe assembly 130 stab the lightening region of the display panel. Furthermore, the probe assembly 130 may be connected with a signal generating assembly, and the signal generating assembly may provide display signals to the display panel through the probes of the probe assembly 130.

FIG. 2-2 illustrates a structural schematic diagram of another display panel testing bench provided ban embodiment of the present disclosure, in which the linkage assembly 140 may further include: a stabilizing wheel 143.

The stabilizing wheel 143 may be disposed on the chassis 120, and may be rotated around an axis of the stabilizing wheel 143 (not illustrated in FIG. 2-2).

The stabilizing wheel 143 may be in movable connection with the drive rod 142. A line connecting a center x1 of the stabilizing wheel 143 and a center x2 of the linkage gear 141 is a linkage line 11. The linkage line 11 is parallel to a length direction c of the drive rod 142.

For example, when the linkage gear 141 drives the drive rod 142 to change the height of the probe assembly 130 from the bench base 110, the stabilizing wheel 143 can makes the length direction c of the drive rod 142 to be parallel to a vertical direction d of the bench base 110, wherein the vertical direction d is a direction perpendicular to an upper surface of the bench base 110.

FIG. 2-2 illustrates a structural schematic diagram of the display panel testing bench when probes of the probe assembly 130 stab the lightening region of the display panel.

Figures 2, 3:
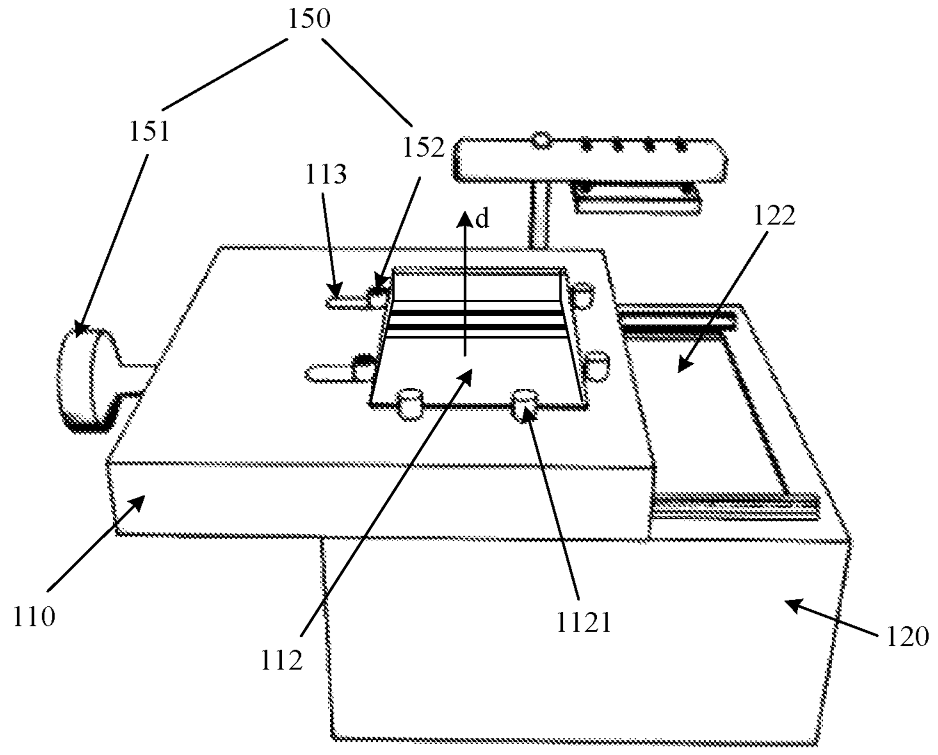

FIG. 2-3 illustrates a structural schematic diagram of another display panel testing bench provided by an embodiment of the present disclosure. The bench may further include: a fixing assembly 150 for fixing the display panel.

The fixing assembly 150 includes: a handle 151 and movable columns 152.

An installing groove 112 passing through the bench base 110 along the vertical direction d of the bench base 110 is disposed on the bench base 110, and the installing groove 112 is used for placing the display panel.

For example, at least one buffer column 1121 is disposed at an edge of an opening of the installing groove 112 on the bench base 110, and the buffer column 1121 is made of a flexible material.

Figures 2, 3, 4:
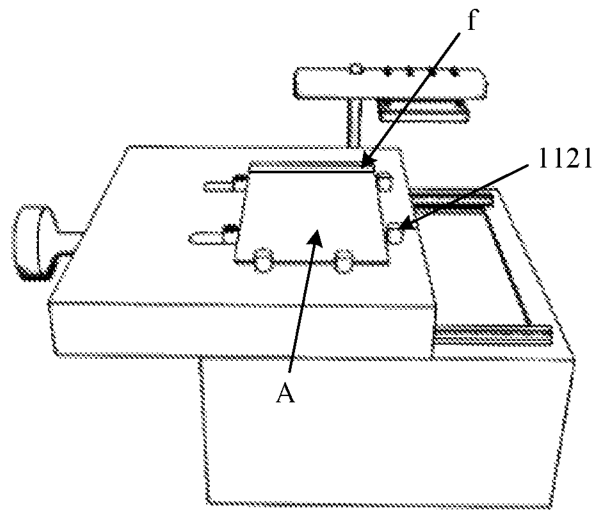
Figures 2, 3, 4, 5:
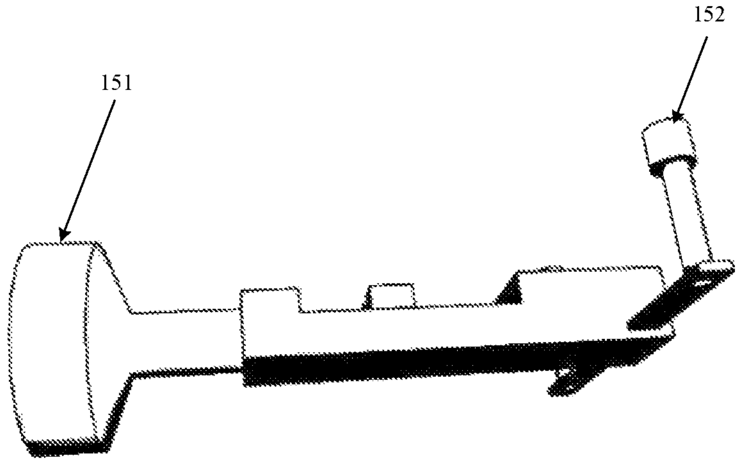
Figures 2, 3, 4, 5, 6:
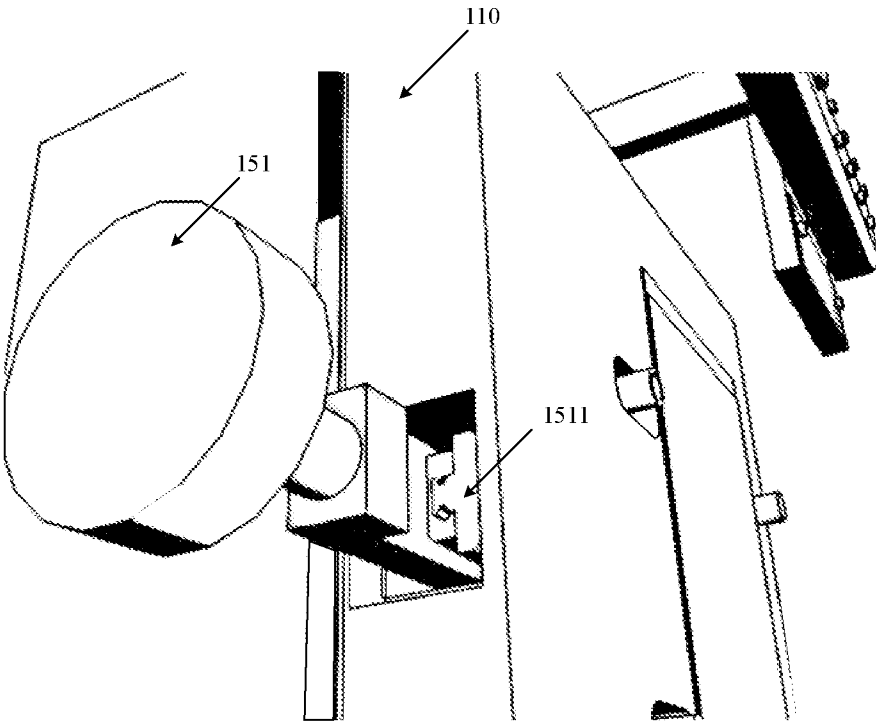
Figures 1, 3:
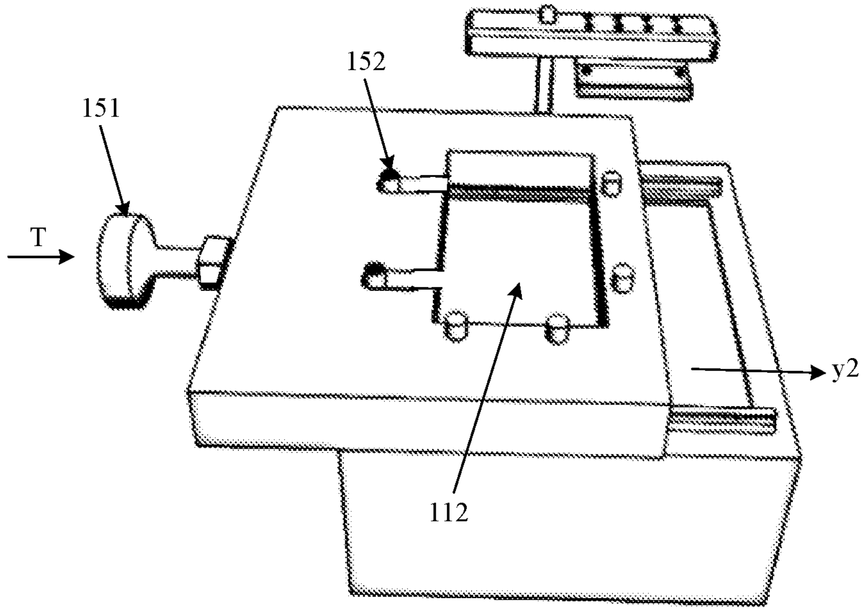
Figures 2, 3:
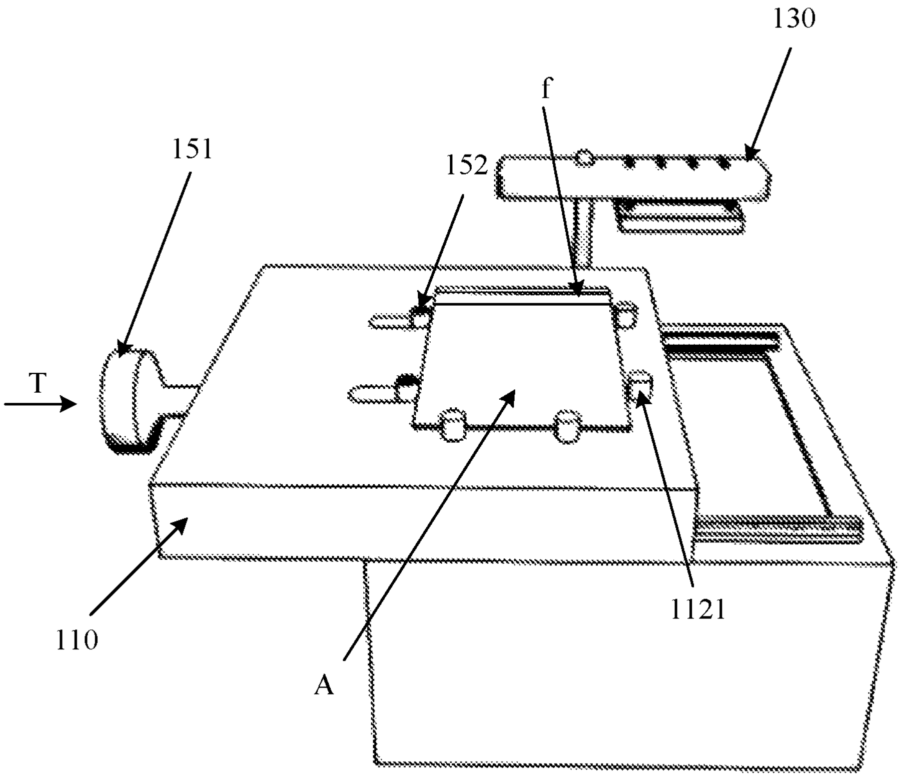

FIG. 2-4 illustrates a structural schematic diagram when the installing groove of the display panel testing bench illustrated in FIG. 2-3 is placed with the display panel. A side of the display panel A is in contact with a side of the at least one buffer columns 1121. Since the at least one buffer columns 1121 are made of a flexible material, the display panel A can be prevented from be damaged when the display panel A is installed at the installing groove. In FIG. 2-4, f may be the lightening region of the display panel A.

As illustrated in FIG. 2-3, a backlight assembly 122 is disposed on the chassis 120 below the installing groove 112, and the backlight assembly 122 can provide backlight to the display panel through the installing groove 112. Furthermore, when the display panel is tested, a polarizing plate may be disposed on the backlight assembly 122 and on the bench base 110 to help with testing the display panel.

Sliding groove 113 may be disposed on the bench base 110, and the sliding groove 113 may be connected to the installing groove 112.

The movable columns 152 are disposed in the sliding groove 113 and are firmly connected with the handle 151, and there may be two movable columns 152. FIG. 2-5 is a structural schematic diagram of the fixing assembly 150, where the movable columns 152 are firmly connected with the handle 151.

In FIG. 2-3, when the handle 151 has a displacement with respect to the bench base 110, the handle 151 can drive the movable columns 152 to slide in the sliding groove 113. When the movable columns 152 slide to a position connecting the sliding groove 113 and the installing groove 112, a side of the movable columns 152 can be in contact with a side of the display panel installed at the installing groove 112, and the display panel is fixed in the installing groove 112.

For example, FIG. 2-6 is a diagram for installing a fixing assembly and the bench base 110, where the handle 151 is connected with the bench base 110 by a handle-slider module 1511.

It should be further described that, in the display panel testing bench provided by the embodiments of the present disclosure, when the drive rod is moved by the stabilizing wheel, the length direction of the drive rod is parallel to the vertical direction of the bench base, thereby obtaining an effect of increasing stability of the display panel.

In summary, the display panel testing bench provided by the embodiments of the present disclosure, the bench base and the probe assembly may be jointly moved by the linkage assembly, so that the bench base can drive the probe assembly to move above the display panel through the linkage assembly when the bench base moves. It solves some problems in a related technology, such as, the probe assembly being controlled manually by the operator pressing it, the probe assembly being difficult to control, and having risks of damaging the display panel. Thus, an effect of the probe assembly being controlled safely and quickly may be achieved.

In order to facilitate understanding, a method for operating the display panel testing bench provided by the embodiments as described above will be described below.

At first, FIG. 3-1 is a schematic diagram illustrating operations of a display panel testing bench without a display panel being disposed therein. Then, the display panel is disposed in an installing groove 112, and the handle 151 is pushed in a direction T (a direction parallel to a moving direction y2 of the bench base), the display panel is fixed by the movable columns 152. FIG. 3-2 is a schematic diagram illustrating operations of the display panel A being fixed in the installing groove by the movable columns 152. For example, the display panel A may be in contact with a buffer column 1121 and the movable columns 152 disposed at an edge of an opening of the installing groove. Then, the handle 151 is pushed continuously in the direction T, the bench base 110 is driven to move towards right. The linkage assembly drives the probe assembly 130 to be close to the display panel A, until the bench base 110 arrives to a predetermined position. The probes in the probe assembly 130 stab the lightening region f of the display panel A. FIG. 2-2 is a schematic diagram of a display panel testing bench when the probes in the probe assembly 130 stab the lightening region f of the display panel. Afterwards, the probe assembly 130 may input display signals to the display panel, and may test the display panel. After the test is performed, when the display panel needs to be taken out, the handle may be pulled in a direction opposite to the direction T, the probes of the probe assembly 130 may be pulled away from the lightening region of the display panel. The movable columns may become noting contact with the display panel. Then, the display panel can be taken outfit can be seen that a whole process for testing the display panel and a process for taking out are simple, safe and quick.

What are described above is related to the illustrative embodiments of the disclosure only and not limitative to the scope of the disclosure; the scopes of the disclosure are defined by the accompanying claims.

The present application claims priority of the Chinese patent application No. 201510307079.7 filed on Jun. 5, 2015, the disclosure of which is incorporated herein by reference in its entirety as part of the present application.

What is claimed is:

1. A display panel testing bench, comprising: a bench base, a chassis, a probe assembly, and a linkage assembly;
- wherein a bench base moving assembly is disposed on the chassis;
- the bench base is configured to be movable on the chassis by the bench base moving assembly, the bench base is configured for fixing a display panel;
- the linkage assembly is disposed on the chassis and is configured to perform a joint movement of the probe assembly and the bench base;
- the probe assembly is disposed above the bench base.

2. The display panel testing bench according to claim 1, wherein, upon the bench base being moved on the chassis by the bench base moving assembly, the bench base drives the linkage assembly, and the probe assembly is driven by the linkage assembly to move above the display panel.

3. The display panel testing bench according to claim 1, wherein, the linkage assembly comprises: a linkage gear and a drive rod;
- a rack is disposed along an edge of the bench base, the rack is coupled with the linkage gear, and a length direction of the rack is parallel to a moving direction of the bench base;
- the drive rod is in movable connection with the linkage gear, and the drive rod is connected with the probe assembly;
- wherein, upon the bench base being moved on the chassis, the rack drives the linkage gear to rotate, and the drive rod is driven by the linkage gear to change a height of the probe assembly from the bench base.

4. The display panel testing bench according to claim 3, wherein, the linkage assembly further comprises: a stabilizing wheel,
- the stabilizing wheel is in movable connection with the drive rod, a line connecting a center of the stabilizing wheel and a center of the linkage gear is a linkage line, and the linkage line is parallel to a length direction of the drive rod,
- wherein, upon the linkage gear driving the drive rod to change the height from the probe assembly to the bench base, and the stabilizing wheel enables the length direction of the drive rod to be parallel to a vertical direction of the bench base.

5. The display panel testing bench according to claim 1, further comprising: a fixing assembly configured to fix the display panel.

6. The display panel testing bench according to claim 1, wherein the fixing assembly comprises: a handle and a movable column,
- an installing groove, passing through the bench base along a direction perpendicular to the bench base, is disposed on the bench base, and the installing groove is configured for the display panel to be disposed therein;
- a sliding groove is disposed on the bench base, and the sliding groove is connected with the installing groove;
- the movable column is disposed in the sliding groove and is firmly connected with the handle;
- wherein, upon the handle being displaced with respect to the bench base, the handle drives the movable column to slide in the sliding groove.

7. The display panel testing bench according to claim 6, wherein,
- at least one buffer columns are disposed at an edge of an opening of the installing groove on the bench base, the buffer columns are made of a flexible material;

wherein, when the installing groove is disposed with the display panel, a side of the display panel is in contact with a side of the at least one buffer columns.

8. The display panel testing bench according to claim 6, wherein, the fixing assembly comprises two movable columns.

9. The display panel testing bench according to claim 6, wherein, a backlight assembly is disposed on the chassis below the installing groove, and the backlight assembly provides light to the display panel through the installing groove.

10. The display panel testing bench according to claim 6, wherein, the handle is connected with the bench base through a handle-slider module.

11. The display panel testing bench according to claim 3, wherein, the drive rod is detachably connected with the probe assembly.

12. The display panel testing bench according to claim 1, wherein, the bench base moving assembly is a bench base slider module.

* * * * *